United States Patent [19]

Hashishita

[11] Patent Number: 4,716,450
[45] Date of Patent: Dec. 29, 1987

[54] SEMICONDUCTOR INTEGRATED CIRCUIT HAVING COMPLEMENTARY FIELD EFFECT TRANSISTORS

[75] Inventor: Ryuichi Hashishita, Tokyo, Japan
[73] Assignee: NEC Corporation, Tokyo, Japan
[21] Appl. No.: 748,840
[22] Filed: Jun. 26, 1985

[30] Foreign Application Priority Data

Jun. 26, 1984 [JP] Japan .................................. 59-131474

[51] Int. Cl.$^4$ .............................................. H01L 27/02
[52] U.S. Cl. ....................................... 357/42; 357/45; 357/68; 357/71
[58] Field of Search ................. 357/42, 45(U.S. only), 357/68, 41, 71, 45 M

[56] References Cited

U.S. PATENT DOCUMENTS

| | | | |
|---|---|---|---|
| 3,599,010 | 8/1971 | Crawford | 357/42 X |
| 4,288,804 | 9/1981 | Kikuchi et al. | 357/42 |
| 4,384,345 | 5/1983 | Mikome | 357/45 X |
| 4,412,240 | 10/1983 | Kikuchi et al. | 357/68 X |
| 4,511,914 | 4/1985 | Remedi et al. | 357/68 X |
| 4,568,961 | 2/1986 | Noto | 357/45 |

FOREIGN PATENT DOCUMENTS

| | | | |
|---|---|---|---|
| 3238311 | 4/1984 | Fed. Rep. of Germany | 357/45 M |
| 58-43568 | 3/1983 | Japan | 357/42 |
| 58-64046 | 4/1983 | Japan | 357/45 M |
| 58-64047 | 4/1983 | Japan | 357/45 M |
| 58-97847 | 6/1983 | Japan | 357/45 M |
| 58-139446 | 8/1983 | Japan | 357/45 M |
| 59-63754 | 4/1984 | Japan | 357/42 |

Primary Examiner—Andrew J. James
Assistant Examiner—Sara W. Crane
Attorney, Agent, or Firm—Burns, Doane, Swecker & Mathis

[57] ABSTRACT

A semiconductor integrated circuit which can be fabricated at high-density and operate at a high speed. The integrated circuit is of the type having p-channel transistors formed on a first region and n-channel transistors formed on a second region adjacent to the first region. Power supply wirings and signal wirings are formed on the first and second regions in the same direction and in parallel.

9 Claims, 6 Drawing Figures

SEMICONDUCTOR INTEGRATED CIRCUIT HAVING COMPLEMENTARY FIELD EFFECT TRANSISTORS

BACKGROUND OF THE INVENTION

The present invention relates to a semiconductor integrated circuit employing complementary MOS transistors.

Complementary MOS (hereinafter referred to as "CMOS") integrated circuits which employ both of n-channel field effect transistors and p-channel transistors have been widely utilized because they consume less electric power. In a CMOS integrated circuit, n-channel field effect transistors and p-channel field effect transistors are formed on different surface regions of a semiconductor substrate. For example, in the case where an n-type semiconductor substrate is employed, p-channel transistors are formed on a certain area of the substrate while a p-type well region is provided on another area of the substrate and n-channel transistors are formed on the well region. In order to arrange the transistors at high density, the above certain region and the well region are adjacently located and power supply wirings are arranged both outer sides of the adjacent certain region and the well regions. While signal wirings for carrying logic signals are extended in the direction normal to that of the power supply wirings through the above two regions. According to this arrangement, the power supply wirings are arranged in parallel and the signal wirings are also arranged in parallel in each wiring group, and hence design in the wiring is easy. The signal wirings are extending beyond the power supply wirings from the transistor region and therefore the signal wirings inevitably overlap the power supply wirings. Therefore, in the case where the power supply wirings are made of low-resistive metal, the signal wirings are usually made of polycrystalline silicon in order to achieve the multilayer wirings with ease. However, as is well known, the resistance of the polycrystalline silicon is relatively large and hence the signal transmission time through the signal wirings is large, resulting in low speed operation. Moreover, the above overlap of the signal wirings on the power supply wirings and the formation of the power supply wirings outside the transistor region make it difficult to form the circuit with the high integration structure.

SUMMARY OF THE INVENTION

It is one object of the invention to provide a semiconductor integrated circuit which can be fabricated with high integration.

It is another object of the present invention to provide a CMOS integrated circuit operable at a high speed.

The semiconductor integrated circuit according to the present invention is of the CMOS type having an n-type transistor region on which p-channel transistors are formed and a p-type transistor region on which n-channel transistors are formed, the n-type transistor region and the p-type transistor region being adjacent from each other, and featured in that at least one power supply wiring extends through both of the p-type and n-type transistor regions and a plurality of signal wirings extend through both of the p-type and n-type transistor regions in parallel with the power supply wiring.

According to the present invention, the power supply wiring and the signal wirings are formed in parallel without overlap therebetween and hence both the power supply wiring and the signal wirings can be made of the same layer of highly conductive material such as aluminum with ease. Furthermore, since the power supply wiring is formed on the transistor regions without any special area outside the transistor regions, the highly integrated structure can be achieved.

DETAILED DESCRIPTION OF THE INVENTION

Figure 1:
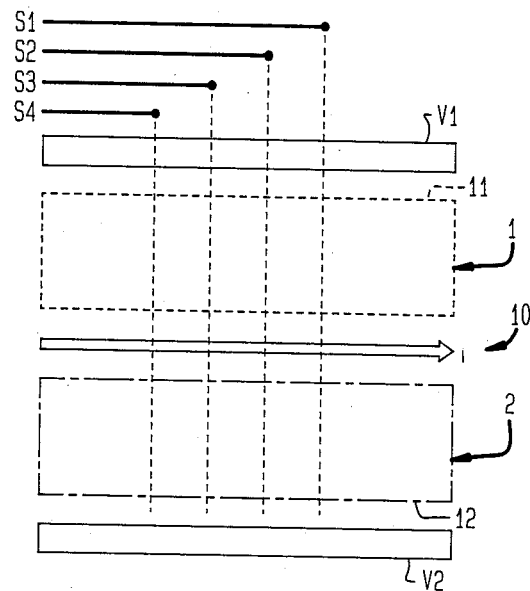
FIG. 1 is a plan view showing a major part of a prior art integrated circuit.

Referring to FIG. 1, a prior art CMOS integrated circuit is briefly explained. As shown in FIG. 1, two rectangular regions 1 and 2 are defined on a semiconductor substrate. The region 1 is, for example, of an n-type conductivity region and the region 2 is of a p-type conductivity region. In this case, p-channel field effect transistors are formed on the region 1 while n-channel field effect transistors are formed on the region 2. Along the upper side periphery 11 of the region 1, a power supply wiring V1 is provided in a lateral direction and another power supply V2 is provided in the lateral direction along the lower side periphery 12 of the region 2. Signal wirings S1 to S4 for carrying logic signals are provided in a vertical direction across the regions 1 and 2 as illustrated. In the drawing, an arrow with a reference "F" indicates the flow of logic processing in the circuit.

According to this arrangement, the power supply wirings V1 and V2 are formed on independent areas which are separate from the regions 1 and 2. Therefore, it has been difficult to fabricate the integrated circuit in a high-density structure. Furthermore, the signal wirings S1 to S4 are required to intersect with the power supply wiring V1 and hence the signal wirings S1 to S4 must be formed by a different layer of conductive material. In general, the power supply wirings V1 and V2 are formed of a highly conductive metal e.g. aluminum and the signal wirings S1 to S4 are formed of a polycrystalline silicon. The resistance of a polycrystalline silicon is relatively high and hence signal transmission time through the signal wirings is inevitably large, resulting in low speed operation.

Figure 2:
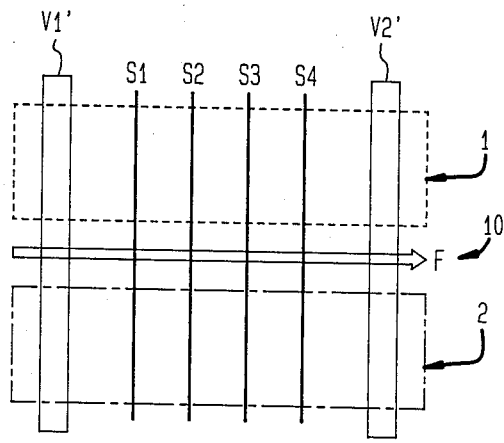
FIG. 2 is a plan view showing a major part of an integrated circuit according to one present invention.

Referring to FIG. 2, a basic structure of a CMOS integrated circuit according to the present invention is explained. In FIG. 2, the portions corresponding to those in FIG. 1 are denoted by the same reference numbers employed in FIG. 1.

As is illustrated in FIG. 2, according to the present invention, instead of arranging the power supply wirings V1 and V2 in the lateral direction along the peripheries 11 and 12 in FIG. 1, the power supply wirings V1' and V2' are arranged in the vertical direction on both the regions 1 and 2. Also, the power supply wirings V1' and V2' are extending in parallel with the signal wirings S1 to S4.

According to this arrangement, since the power supply wirings V1' and V2' are formed on the transistor regions 1 and 2, the area solely required for the wirings V1' and V2' are not necessary. Moreover, the power supply wirings V1' and V2' and the signal wirings S1 and S4 are arranged in parallel and both of the wirings have no overlapping portion therebetween, and hence the signal wirings S1 to S4 can be formed of the same wiring layer as the power supply wirings V1' and V2'. Namely, both of the signal wirings S1 to S4 and the power supply wirings V1' and V2' can be made by the same highly conductive material such as aluminum. Accordingly, the signal wirings S1 to S4 can be provided with low impedance as well as the power supply wiring.

Referring to FIGS. 3 to 6, a detailed embodiment of the present invention is explained.

Figure 3:
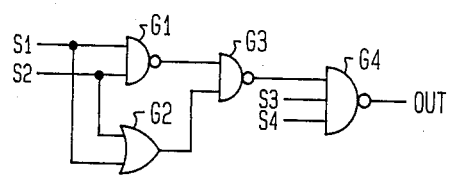
FIG. 3 is a schematic block diagram showing a logic circuit.

FIG. 3 shows one example of a logic diagram of the circuit to be realized by the embodiment. As shown in FIG. 3, the logic circuit to be fabricated in this embodiment includes a NAND gate G1 receiving signals S1 and S2, an OR gate G2 receiving the signals S1 and S2, and NAND gate G3 receiving the outputs of the gates G1 and G2, and a NAND gate G4 receiving signals S3 and S4 and the output of the gate G3.

Figure 4:
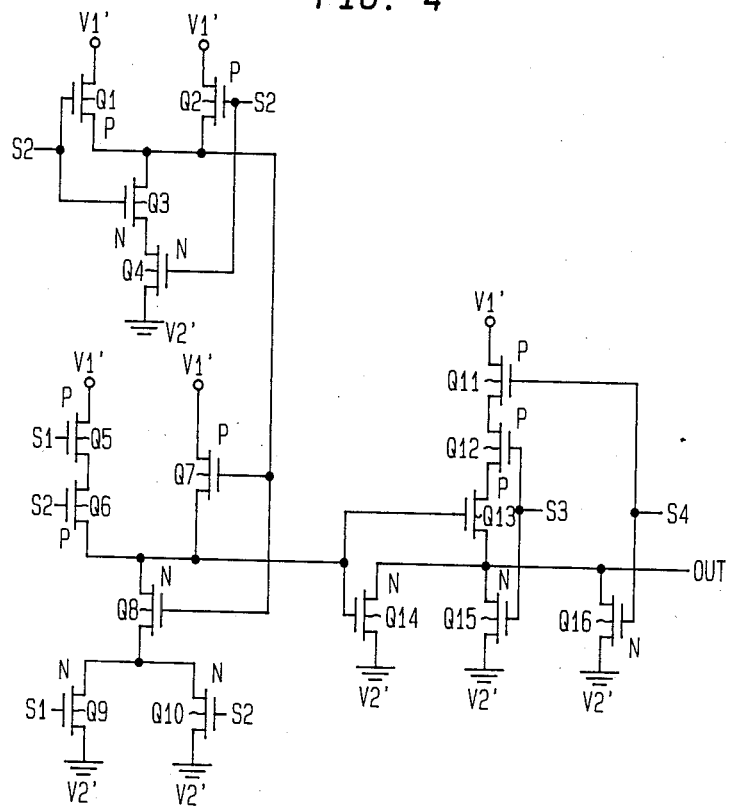
FIG. 4 is a schematic circuit diagram of the logic circuit of FIG. 3.

FIG. 4 shows a schematic circuit diagram of the logic circuit of FIG. 3.

Figure 5:
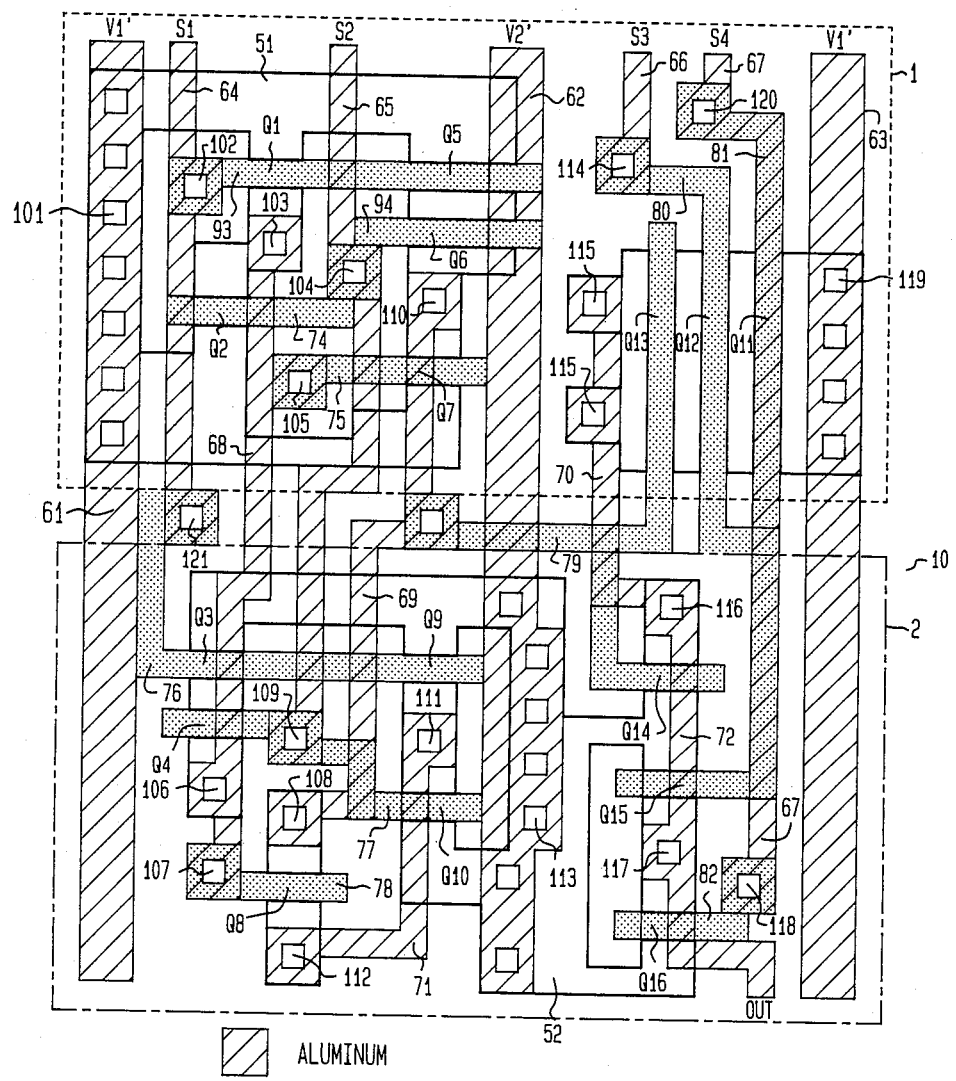
FIGS. 5 and 6 are plan view showing one embodiment of the invention.
Figure 6:
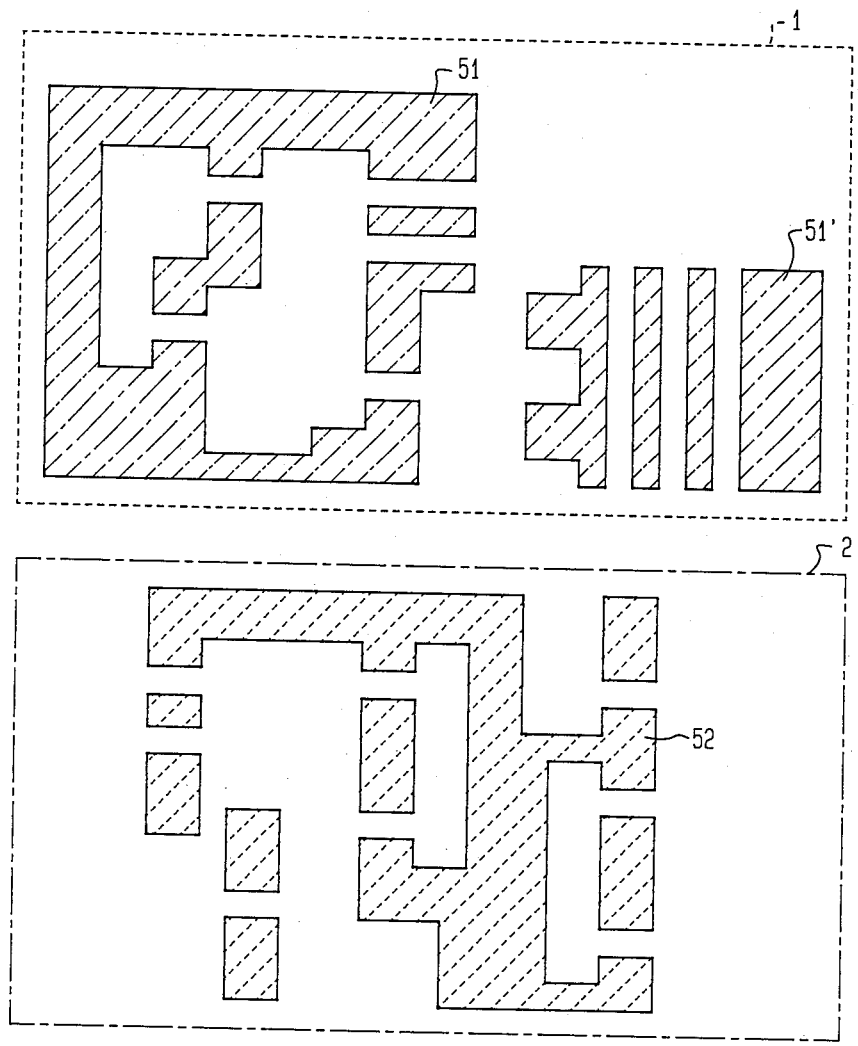

Referring to FIGS. 5 and 6, a detailed layout of the circuit shown in FIG. 4 according to the invention is described.

On a semiconductor substrate 10, an n-type conductivity region 1 and a p-type conductivity region 2 are adjacently provided. P-channel transistors are formed on the region 1 while n-channel transistors are formed on the region 2.

A wiring 61 made of aluminum serves as the V1' line and is extended in the vertical direction along and on the left side peripheries of the regions 1 and 2. A wiring 63 made of aluminum also serves as the V1' and is arranged in the vertical direction along and on the right side peripheries of the regions 1 and 2. An aluminum wiring 62 serves as the V2' line and is extending in the vertical direction through the center parts of the regions 1 and 2. Wirings 64 to 67 made of aluminum serve as the signal input lines S1 to S4, respectively and are extending in the vertical direction. The wiring 64 is connected to a polycrystalline silicon wiring 73 serving as gates of the p-channel transistors Q1 and Q5 through a contact 102 and connected to a polycrystalline silicon wiring 76 serving gates of the n-channel transistors Q3 and Q9 through a contact 121. The wiring 65 is connected to a polycrystalline silicon wiring 74 serving as the gates of the p-channel transistors Q2 and Q6 through a contact 104 and connected to a polycrystalline silicon wiring 77 serving as the gates of the n-channel transistors Q4 and Q10 through a contact 109. The wiring 66 is connected to a polycrystalline silicon wiring 80 serving a gate of the p-channel transistor Q12 and a gate of the n-channel transistor Q15 through a contact 114. The wiring 67 is connected to a polycrystalline silicon wiring 81 serving as a gate of the p-channel transistor Q11 through a contact 120 and to a polycrystalline silicon wiring 82 serving as a gate of the n-channel transistor Q16. An aluminum wiring 68 performs an internal connections connecting the commonly connected sources of Q1 and Q2 to gates of the transistors Q7 and Q8 via a contact 103, a polycrystalline silicon wiring 75, a contact 107 and a polycrystalline wiring 78.

An aluminum wiring 72 connects the drains of the transistors Q14, Q15 and Q16 to form an output terminal OUT.

The power wiring lines 61 and 63 are coupled to the p-type diffusion regions 51 and 51' via contacts 101 and 119, respectively. The power supply wiring 62 is connected to an n-type diffusion region 52 in the region 2 via contacts 113.

FIG. 6 shows a pattern of the diffusion regions 51, 51' and 52 for easier understanding.

As is apparent from FIG. 5, the power supply wirings 61, 62 and 63 (V1', V2') are provided on the transistor forming regions 1 and 2 and hence any special area solely required for the wirings V1', V2' are not necessary. Moreover, the signal wirings 64 to 67 are formed in parallel with the power wirings 61 to 63 and of the same conductive layer (aluminum). Therefore, the signal wirings 64 to 67 can be provided with low impedance characteristics.

As has been described, according to the present invention, the semiconductor integrated circuit which can be fabricated at high-density and can operate at a high speed, is obtained.

I claim:

1. A semiconductor integrated circuit comprising
a semiconductor substrate;
a first transistor forming region of a first conductivity type elongated in a first direction;
a second transistor forming region of a second conductivity type elongated in said first direction, said first and second transistor forming regions provided being adjacent and parallel to each other;
a plurality of first field effect transistors formed on said first transistor forming region and distributed in said first direction over substantially an entire area of said first transistor forming region;
a plurality of second field effect transistors formed on said second transistor forming region and distributed in said first direction over substantially an entire area of said second transistor forming region;
a plurality of first wirings formed on said first and second transistor forming regions, at least a portion of said first wirings extending in said first direction on said first and second transistor forming regions, gates of said first and second transistors being formed with said first wirings;
first and second power supply wirings extending in a second direction perpendicular to said first direction, each of said first and second power supply wirings passing over each of said first and second transistor forming regions;
a plurality of signal wirings extending in said second direction and passing over each of said first and second transistor forming regions, said first and second power supply wirings and said signal wirings being nonsuperposed and formed on the same wiring layer level;
means for electrically connecting said first and second field effect transistors to said signal wirings;
means for electrically connecting said first power supply wiring to a part of said first transistor forming region; and
means for electrically connecting said second power supply wiring to a part of said second transistor forming region.

2. The integrated circuit according to claim 1, in which said first wirings are formed of a polycrystalline silicon.

3. The integrated circuit according to claim 1, in which said first and second power supply wirings and said signal wirings are formed of aluminum.

4. the integrated circuit according to claim 1, in which each of said first and second transistor forming regions has a rectangular shape and the adjacent edges of said first and second transistor forming regions are parallel to said first direction.

5. The integrated circuit according to claim 1, in which said signal wirings are partially located above said first and second field effect transistors.

6. A semiconductor integrated circuit comprising
a plurality of first field effect transistors of a first channel conductivity type formed on a first semiconductor region extending in a first direction;
a plurality of second field effect transistors of a second channel conductivity type formed on a second semiconductor region extending in said first direction, said first semiconductor region and said second semiconductor region being located adjacent each other, adjacent peripheries of said first and second semiconductor regions being located along an axis which extends in said first direction;
a plurality of gate wirings formed on said first and second semiconductor regions and serving as gates of said first and second field effect transistors;
a plurality of power supply wirings extending over said first and second semiconductor regions in a second direction perpendicular to said first direction, each of said power supply wirings passing over both of said first and second semiconductor regions; and
a plurality of signal wirings extending over said first and second semiconductor regions in said second direction, said signal wirings being located above a portion of said first and second field effect transistors each of said signal wirings passing over both of said first and second semiconductor regions, said signal wirings and said power supply wirings being nonsuperposed and formed on the same conductive layer level.

7. The integrated circuit according to claim 6, in which said gate wirings are formed of polycrystalline silicon.

8. The integrated circuit according to claim 6, in which said power supply wirings and said signal wirings are formed of aluminum.

9. The integrated circuit according to claim 6, in which said signal wirings and said gate wirings are selectively connected electrically.

* * * * *